(12) United States Patent
Matsui

(10) Patent No.: US 6,473,828 B1
(45) Date of Patent: Oct. 29, 2002

(54) VIRTUAL CHANNEL SYNCHRONOUS DYNAMIC RANDOM ACCESS MEMORY

(75) Inventor: Yoshinori Matsui, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/347,491

(22) Filed: Jul. 2, 1999

(30) Foreign Application Priority Data

Jul. 3, 1998 (JP) .......................................... 10-189059

(51) Int. Cl.[7] .............................................. G06F 12/00
(52) U.S. Cl. ...................... 711/104; 365/191; 365/233
(58) Field of Search .................... 711/104; 365/233, 365/191, 194

(56) References Cited

U.S. PATENT DOCUMENTS

| 5,748,560 A | * | 5/1998 | Sawada | 365/233 |
| 5,808,961 A | * | 9/1998 | Sawada | 365/233 |
| 5,926,434 A | * | 7/1999 | Mori | 365/233 |

FOREIGN PATENT DOCUMENTS

| JP | 57-20983 | 2/1982 |
| JP | 4-252486 | 9/1982 |
| JP | 60-7690 | 1/1985 |
| JP | 62-38590 | 2/1987 |
| JP | 1-146187 | 6/1989 |
| JP | 4-318389 | 11/1992 |
| JP | 5-2872 | 1/1993 |
| JP | 11-86532 | 3/1999 |
| JP | 11-86559 | 3/1999 |

* cited by examiner

*Primary Examiner*—Do Hyun Yoo
*Assistant Examiner*—Nasser Moazzami
(74) *Attorney, Agent, or Firm*—Darryl G. Walker

(57) ABSTRACT

According to one embodiment, a virtual channel synchronous dynamic random access memory (VCSDRAM) (100) can perform a high-frequency test with lower frequency test equipment. The VCSDRAM (100) can include a command decoder circuit (102) that can receive a transfer command and provide a transfer command signal (124). A transfer operation start signal generating circuit (106) can receive and latch the transfer command signal (124). The command decoder circuit (102) can then receive an active command and provide an active command signal (120). The active command signal (120) can result in the generation of a main storage activating signal (128). Having latched the transfer command signal (124), the transfer operation start signal generating circuit (106) can generate a transfer operation start signal (130) in response to the active command signal (120). The transfer operation start signal (130) can generate a control signal (132). In response to the control signal (132), data can be transferred between a main storage portion (114) and a substorage portion (116).

20 Claims, 8 Drawing Sheets

| COMMAND | CKE n-1 | CKE n | /CS | /RAS | /CAS | /WE | A13 | A12 | A11 | A10 | A9 | A8 | A7 | A6 | A5 | A4 | A3 | A2 | A1 | A0 |
|---|---|---|---|---|---|---|---|---|---|---|---|---|---|---|---|---|---|---|---|---|
| Read | H | X | L | H | L | H | X | X | X | \multicolumn{4}{l}{SRAM COLUMN SELECTION} | | | | X | \multicolumn{4}{l}{SRAM ROW SELECTION} | | | |
| Write | H | X | L | H | L | L | X | X | X | \multicolumn{4}{l}{SRAM COLUMN SELECTION} | | | | X | \multicolumn{4}{l}{SRAM ROW SELECTION} | | | |
| Prefetch | H | X | L | H | H | L | Bank Select | X | X | L | L | X | X | DRAM ROW SELECTION | DRAM ROW SELECTION | X | \multicolumn{4}{l}{SRAM ROW SELECTION} | | | |
| Prefetch (Auto-Precharge) | H | X | L | H | H | L | Bank Select | X | X | H | L | X | X | DRAM ROW SELECTION | DRAM ROW SELECTION | X | \multicolumn{4}{l}{SRAM ROW SELECTION} | | | |
| Restore | H | X | L | H | H | L | Bank Select | X | X | L | H | X | X | DRAM ROW SELECTION | DRAM ROW SELECTION | X | \multicolumn{4}{l}{SRAM ROW SELECTION} | | | |
| Restore (Auto-Precharge) | H | X | L | H | H | L | Bank Select | X | X | H | H | X | X | DRAM ROW SELECTION | DRAM ROW SELECTION | X | \multicolumn{4}{l}{SRAM ROW SELECTION} | | | |
| Active | H | X | L | L | H | H | Bank Select | \multicolumn{9}{l}{DRAM ROW SELECTION} | | | | | | | | | | |
| Precharge | H | X | L | L | H | L | Bank Select | X | X | L | X | X | X | X | X | X | X | X | X | X |
| All-Bank Precharge | H | X | L | L | H | L | X | X | X | H | X | X | X | X | X | X | X | X | X | X |
| CBR Refresh | H | X | L | L | L | H | X | X | X | X | X | X | X | X | X | X | X | X | X | X |
| No Operation | H | X | L | H | H | H | X | X | X | X | X | X | X | X | X | X | X | X | X | X |
| DESELECT DEVICE | H | X | H | X | X | X | X | X | X | X | X | X | X | X | X | X | X | X | X | X |
| REGISTER SETTING (1) | H | X | L | L | L | L | L | L | L | L | L | L | L | H | X | X | X | X | X | X |
| REGISTER SETTING (2) | H | X | L | L | L | L | L | L | L | L | L | L | H | L | X | X | \multicolumn{4}{l}{REGISTER SETTING} | | | |

FIG. 3

VIRTUAL CHANNEL SYNCHRONOUS DYNAMIC RANDOM ACCESS MEMORY

TECHNICAL FIELD

The present invention relates generally to "virtual" channel memories, and more particularly to the testing of such memories.

BACKGROUND OF THE INVENTION

Many computer systems can include a main storage. Typically, a main storage can include high capacity semiconductor devices that are relatively inexpensive. One such semiconductor device is a general purpose dynamic random access memories (DRAMs). A drawback to general purpose DRAMs is that such devices can have relatively slow operating speeds.

More recent computer systems can have increased operating speeds. In particular, computer system microprocessor unit (MPU) speeds have increased. While general purpose DRAM speeds have also increased, such increases in speed have generally not been sufficient to keep up with MPU speeds. Due to such operating speed differences, mainstream systems are usually equipped with a substorage device between a main storage and a MPU. Such substorage devices are typically referred to as "cache" memories. A cache memory can utilize a high-speed static RAM (SRAM), an emitter coupled logic bipolar RAM (ECLRAM), or other such storage devices.

A cache memory may be external to a MPU or may be built within a MPU. Recently however, some workstations or personal computers have included a semiconductor storage device having a main storage device formed from a DRAM and a cache memory formed from a high-speed SRAM. The DRAM and SRAM are formed on the same semiconductor substrate.

Prior art semiconductor devices have been disclosed in Japanese Patent Laid-Open Publication No. Sho 57-20983, Japanese Patent Laid-Open Publication No. Sho 60-7690, Japanese Patent Laid-Open Publication No. Sho 62-38590, Japanese Patent Laid-Open Publication No. Hei 1-146187. Since devices that include a DRAM and SRAM can use the SRAM as a cache, such devices are often referred to as cache DRAMs or CDRAMs.

CDRAMs can be arranged to transfer data between the DRAM and SRAM parts in a bi-directional fashion. When a memory is accessed, if the requested data location is in the SRAM portion, the access can be considered a cache "hit." If a requested data location is not in the SRAM portion, the access can be considered a cache "miss." A drawback to conventional CDRAMs is that a cache miss can result in a data transfer operation that can include some delay.

A number of prior art techniques have been proposed to address the above drawback to CDRAMs. A number of prior art semiconductor devices are set forth in Japanese Patent Laid-Open Publication Hei 4-252486, Japanese Patent Laid-Open Publication Hei 4-318389, and Japanese Patent Laid-Open Publication Hei 5-2872. These publications disclose CDRAMs having bi-directional transfer gate circuits between a DRAM portion and a SRAM portion. The bi-directional transfer gate circuits can have a latch or register function. With a latch or register function it can be possible to perform a data transfer from the SRAM portion to the DRAM portion and a data transfer from the DRAM portion to the SRAM portion at the same time.

Despite the advantages of the above references, such as Japanese Patent Laid-Open Publication Hei 4-318389 and the like, such approaches can have problems. One such problem is pin count. Because the DRAM portion and SRAM portion have their own respective address pins, the number of pins on a CDRAM can be much larger than those of a conventional DRAM. Therefore, a CDRAM device is not compatible with an ordinary DRAM or the like.

A second problem associated with conventional CDRAMs is the amount of area that may be needed to realize a data transfer circuit. Because the area available for such circuits can be limited, the number of transfer bit lines between a DRAM and SRAM portion can also be limited.

Due to the above constraints, the number of data bits that can be transferred at the same time between a DRAM portion and an SRAM portion on a CDRAM can be limited. As one example, the number of bits can be limited to 16 bits. Further, many CDRAMs avoid placing transfer lines in the same area as column select lines. As a result, the number of transfer lines can further be limited, as the available areas for such lines can have a limited width. As a general rule, the smaller the number of bits that can be transferred between DRAM and SRAM portions, the lower hit rate of the cache. One skilled in the art would recognize that lower cache hit rates lead to slower overall data access operations for a CDRAM.

One skilled in the art would recognize that a main storage can receive memory accesses from different controllers (masters). Such multiple masters can also adversely impact system speed. In order to increase the speed of a system without lowering the hit rate of a cache, even in the case of multiple masters, a novel virtual channel SDRAM. (VCSDRAM) has been developed by the present inventor. Such a VCSDRAM can include a main storage portion and a substorage portion. The substorage portion can be allocated into a plurality of access registers. Reference is made to Japanese Patent Laid-Open Publication Hei 11-86559 and Japanese Patent Laid-Open Publication Hei 11-86532.

Referring now to FIG. 9, a VCSDRAM according to the present inventor is set forth in a block schematic diagram. The VCSDRAM of FIG. 9 is designated by the general reference character 900, and is shown to include a command decoder circuit 902, a main storage activating signal generating circuit 904, a transfer operation start signal generating circuit 906, a transfer operation control circuit 908, an operation mode setting circuit 910, a main storage control circuit 912, a main storage portion 914, a substorage portion 916, and a data transfer portion 918.

The command decoder circuit 902 can receive four command signals RASB, CASB, WEB and CSB as inputs, and generate a number of internal signals. Internal signals can include an active command signal 120, a precharge command signal 122, and a transfer command signal 124.

The main storage activating signal generating circuit 904 can receive an active command signal 120 and a precharge command signal 122 and provide a main storage activating signal 128.

The transfer operation start signal generating circuit 906 can receive a transfer command signal 124 and provide a transfer operation start signal 130.

The transfer operation control circuit 908 can receive a transfer operation start signal 130 and provide a storage control signal 132 that can control a substorage portion 916 and a data transfer portion 918. Once a data transfer operation has ended, the transfer operation control circuit 908 can activate a transfer reset signal 134 that is connected to the transfer operation start signal generating circuit 906. An active transfer reset signal 134 can release the latched state of a transfer command within the transfer operation start signal generating circuit 906.

The operation of the VCSDRAM will now be described in conjunction with FIG. 4. FIG. 4 is a timing diagram illustrating the operation of a VCSDRAM.

A command decoder circuit 902 can receive an active command, shown as "401," and output an active command signal 120. The main storage activating signal generating circuit 904 can receive the active command signal 120 and provide a main storage activating signal 128 on the basis of the active command signal 120.

Next, a command decoder circuit 902 can receive a transfer command, shown as "402," and output a transfer command signal 124.

The transfer operation start signal generating circuit 906 can receive a transfer command signal 124. The transfer command signal 124 can be latched and held, and a transfer operation start signal 130 can be activated (driven high).

Next, a transfer operation control circuit 908 can receive an active transfer operation start signal 130 and activate a storage control signal 132 (drive it high). The storage control signal 132 can control the substorage portion 916 and control the transfer of data by the data transfer portion 918.

When a storage control signal 132 is activated, the main storage control circuit 912 and data transfer portion 918 can be activated. The data transfer portion 918 can perform a data transfer operation between a main storage portion 914 and substorage portion 916.

Once a data transfer operation between a main storage portion 914 and a substorage. portion 916 has ended, the transfer operation control circuit 908 can activate a transfer reset signal 134.

An active transfer reset signal 134 can be received by the transfer operation start signal generating circuit 906. In response to the active transfer reset signal 134, a transfer command that is latched within the transfer operation start signal generating circuit 906 is released, resulting in the transfer operation start signal 130 being deactivated (low).

FIG. 4 also illustrates a time period T0. T0 can represent the period of an external clock signal CLK. Another time period is shown as Td. Td can represent the interval between the activation of a main storage portion 914 by a main storage control circuit 912 and the time when a data transfer operation takes place in response to a storage control signal 132.

It is noted that in a VCSDRAM such as that set forth in FIG. 9, the duration of the Td time period can affect the operation of the VCSDRAM. For example, a Td time that is too short can lead to insufficient amplification of memory cell data within a main storage portion 914. One skilled in the art would recognize that insufficient amplification of memory cell data can lead to erroneous read and/or write operations. Further, the shorter a Td time, the more likely fluctuations in a power supply voltage (such as a high power supply voltage and a ground supply potential) will adversely affect the operation of the VCSDRAM.

The Td time for a VCSDRAM can result in VCSDRAMs being tested for a minimum Td time specification. Because VCSDRAMs can have high frequency operating speeds, to ensure a Td specification, a high frequency test machine can be used. A drawback to high frequency test machines is that such machines can be expensive.

SUMMARY OF THE INVENTION

An object of the present invention is to provide a virtual channel synchronous dynamic random access memory (VCSDRAM) that can be tested for a high frequency operation with test machines of relatively low frequency. Such low frequency test machines can be less expensive than high frequency test machines.

To achieve the above-mentioned object, a VCSDRAM according to one embodiment of the present invention can include a main storage portion and a substorage portion. Data can be transferred between the main storage portion and the substorage portion according to a transfer operation start signal. The VCSDRAM can further include a command decoder and a transfer operation start signal generator.

A command decoder circuit can decode external command signals and generate internal control signals including at least an active command signal, a precharge signal, and a transfer command signal. An active command signal can generate a main storage activating signal.

A transfer operation start signal generating circuit can latch a transfer command signal and output a transfer operation start signal. A transfer operation start signal can be output according to a main storage activating signal and reset by a transfer reset signal. A transfer reset signal can be activated after a data transfer operation has ended.

Within a transfer operation start signal generating circuit, a latch which latches a command signal can be released by a precharge command signal or by a mode register set command signal, or by both of these signals.

According to one aspect of an embodiment, the release of a latch by a precharge command signal or a mode register set signal can occur at the time power is provided to a VCSDRAM.

A VCSDRAM according to another embodiment can include a main storage portion and a substorage portion. Data can be transferred between the main storage portion and the substorage portion according to a transfer operation start signal. The VCSDRAM can further include a command decoder, a transfer operation start signal generator, and a transfer operation control circuit.

A command decoder circuit according to the above embodiment can decode external command signals and generate internal control signals including at least an active command signal, a precharge signal, and a transfer command signal. An active command signal can generate a main storage activating signal.

A transfer operation start signal generating circuit according to the above embodiment can latch a transfer command signal and output a transfer operation start signal. A transfer operation start signal can be output according to a main storage activating signal and reset by a transfer reset signal. A transfer reset signal can be activated after a data transfer operation has ended.

A transfer operation control circuit according to the above embodiment can receive a transfer operation start signal and generate a control signal. The control signal can control the transfer of data between the main storage portion and the substorage portion.

According to one aspect of the above embodiment, a VCSDRAM can further include a main storage activating signal generating circuit that can receive an active command signal and a precharge command signal from the command decoder circuit and provide a main storage activating signal.

According to another aspect of the above embodiment, when power is applied to the VCSDRAM, the command decoder circuit can generate a precharge command signal or a mode register set command signal, or both. Such signals can initialize the transfer operation start signal generating circuit.

BRIEF DESCRIPTION OF THE DRAWINGS

FIG. 3 is a table illustrating various operating commands that may be performed by the embodiments.

DETAILED DESCRIPTION OF THE EMBODIMENTS

Various embodiments will now be described with reference to a number of drawings.

Figure 1:
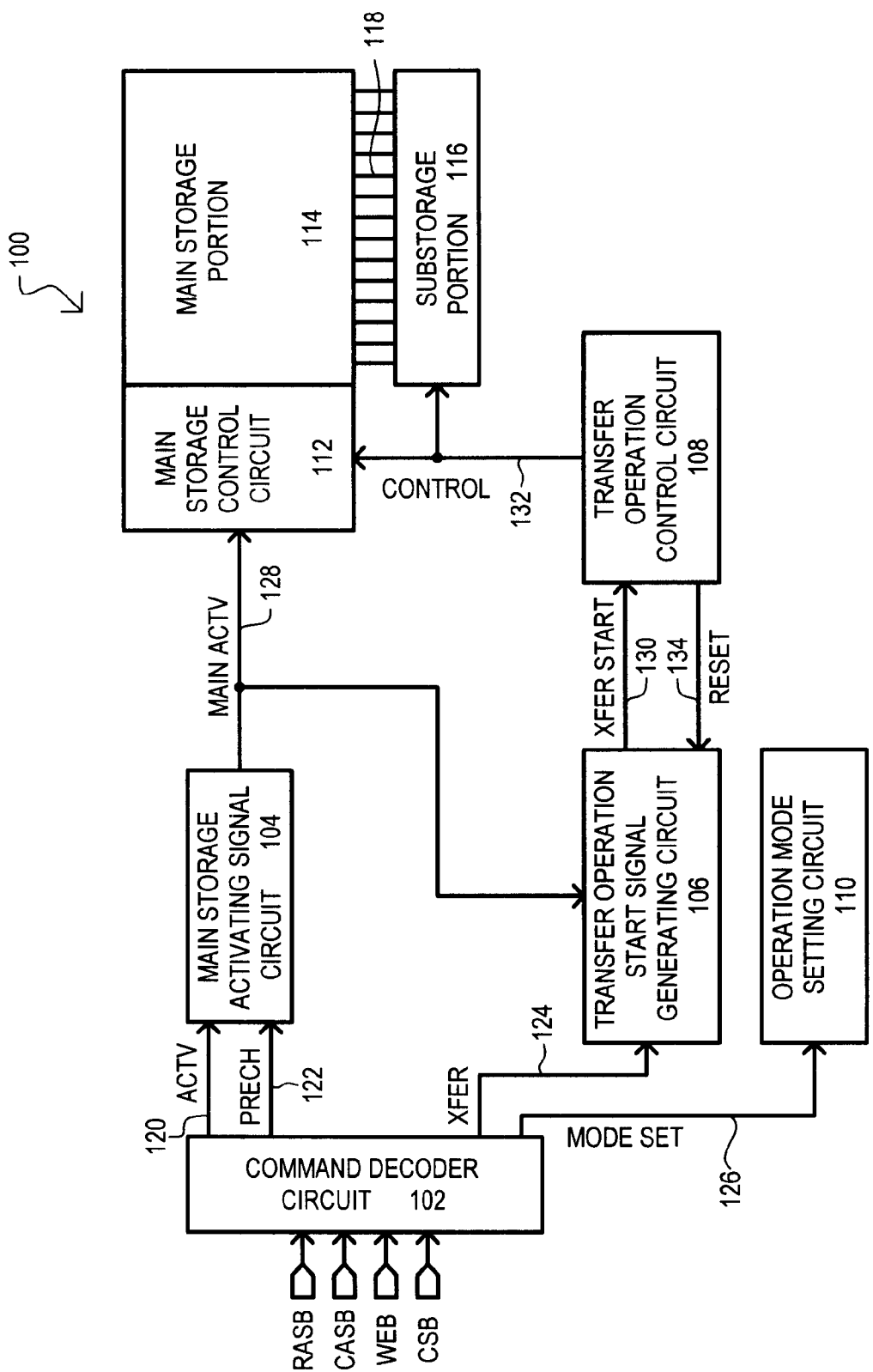
FIG. 1 is a block diagram of a first embodiment.

A first embodiment is set forth in a block diagram in FIG. 1. The first embodiment is designated by the general reference character 100, and is shown to include a command decoder circuit 102, a main storage activating signal circuit (main store activator) 104, a transfer operation start signal generating circuit (transfer starter) 106, a transfer operation control circuit (transfer controller), 108, an operation mode setting circuit 110, a main storage control circuit 112, a main storage portion 114, a substorage portion 116, and a data transfer circuit 118.

The particular command decoder circuit 102 of the first embodiment can receive a number of command signals, including a row address strobe signal (such as RASB or/RAS), a column address strobe signal (such as CASB or/CAS), a write enable signal (such as WEB or/WE), and a chip select signal (such as CSB or/CS). The command decoder circuit 102 can decode various command signal combinations and generate a number of internal command signals. Internal command signals can include an active command signal (ACTV) 120, a precharge command signal (PRECH) 122, a transfer command signal (XFER) 124, and a mode register set command signal (MODE SET) 126.

The main store activator 104 can receive an ACTV signal and a PRECH signal and generate a main store activating signal (MAIN ACTV) 128.

The transfer starter 106 can receive the XFER signal and MAIN ACTV signal and generate a transfer operation start signal (XFER START) 130.

The transfer controller 108 can receive the XFER START signal and generate a storage control signal (CONTROL). Once a transfer operation has ended, the transfer controller 108 can generate a transfer reset signal (RESET). The RESET signal can be received by the transfer starter 106. The RESET signal can release the latched state of the XFER signal.

The operation mode setting circuit 110 can receive the MODE SET command. According to the mode set command, the mode setting circuit 110 can set various operating mode parameters for the VCSDRAM. As just a few examples, data input/output burst length and burst type can be established.

Figure 6:
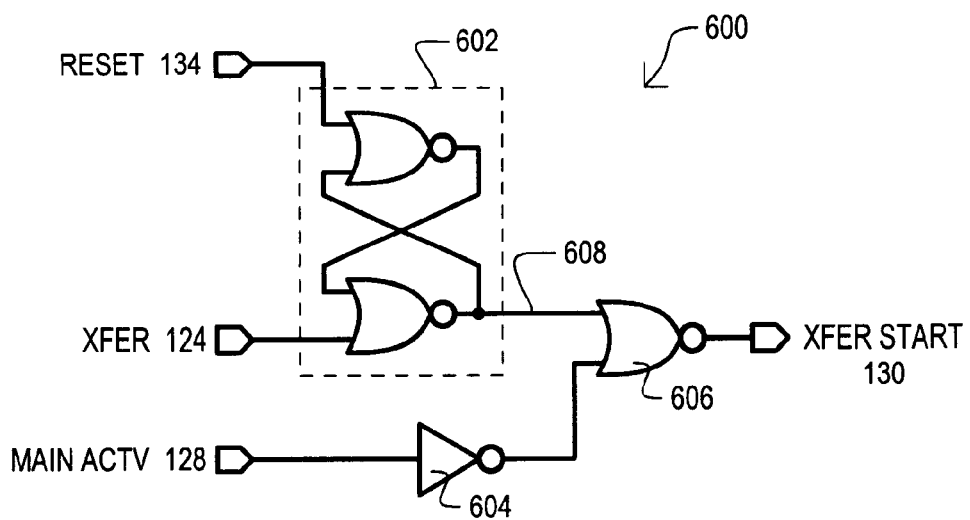
FIG. 6 is a schematic diagram illustrating a transfer operation start signal generating circuit that may be used in the first embodiment.

Referring now to FIG. 6, a schematic diagram is set forth illustrating one example of a transfer starter (such as 106 in FIG. 1). The transfer starter of FIG. 6 is designated by the general reference character 600, and is shown to include a latch circuit 602, an inverter 604, and a NOR circuit 606.

The latch circuit 602 can receive and latch a XFER signal 124 generated by a command decoder circuit 102.

The inverter 604 can receive a MAIN ACTV signal as an input. The output of the inverter 604 is provided as one input to NOR gate 606. The other input of NOR gate 606 is connected to the output node 608 of latch circuit 602. The output of NOR gate 606 can provide the XFER START signal.

One skilled in the art would recognize that, provided the output node 608 is previously high, when the RESET and XFER signals are low, the output node 608 will remain high. In operation, the latch circuit 602 can receive an active XFER signal (a high pulse, for example) which can result in the XFER signal being latched, and the output node 608 being driven low.

If a main storage portion has been activated at the time the output node 608 is driven low, the MAIN ACTV signal will be high. The high value can be inverted by inverter 604 to provide a low input to NOR gate 606. This input, combined with the low output node 608 can drive the XFER START signal high. In this way, a transfer operation between a main storage portion (such as 114) and a substorage portion (such as 116) can be started.

However, if a main storage portion has not been activated, the MAIN ACTV signal will be low. The low value can be inverted by inverter 604 to provide a high input to NOR gate 606. This input will force the XFER START signal low, preventing a transfer operation from starting.

As was noted previously, once a transfer operation has ended, the RESET signal can be activated (pulse high). The high RESET signal can result in the latch circuit being released. Consequently, the output node 608 can be drive high. A high output node 608 can force the XFER START signal high.

One skilled in the art would recognize that an alternate way to conceptualize the operation of the latch circuit 602 of FIG. 6 is to consider the latch circuit 602 as having a set and reset operation. When viewed in this manner, a latch circuit 602 can be set by a XFER signal and reset by the RESET signal.

Figure 2:
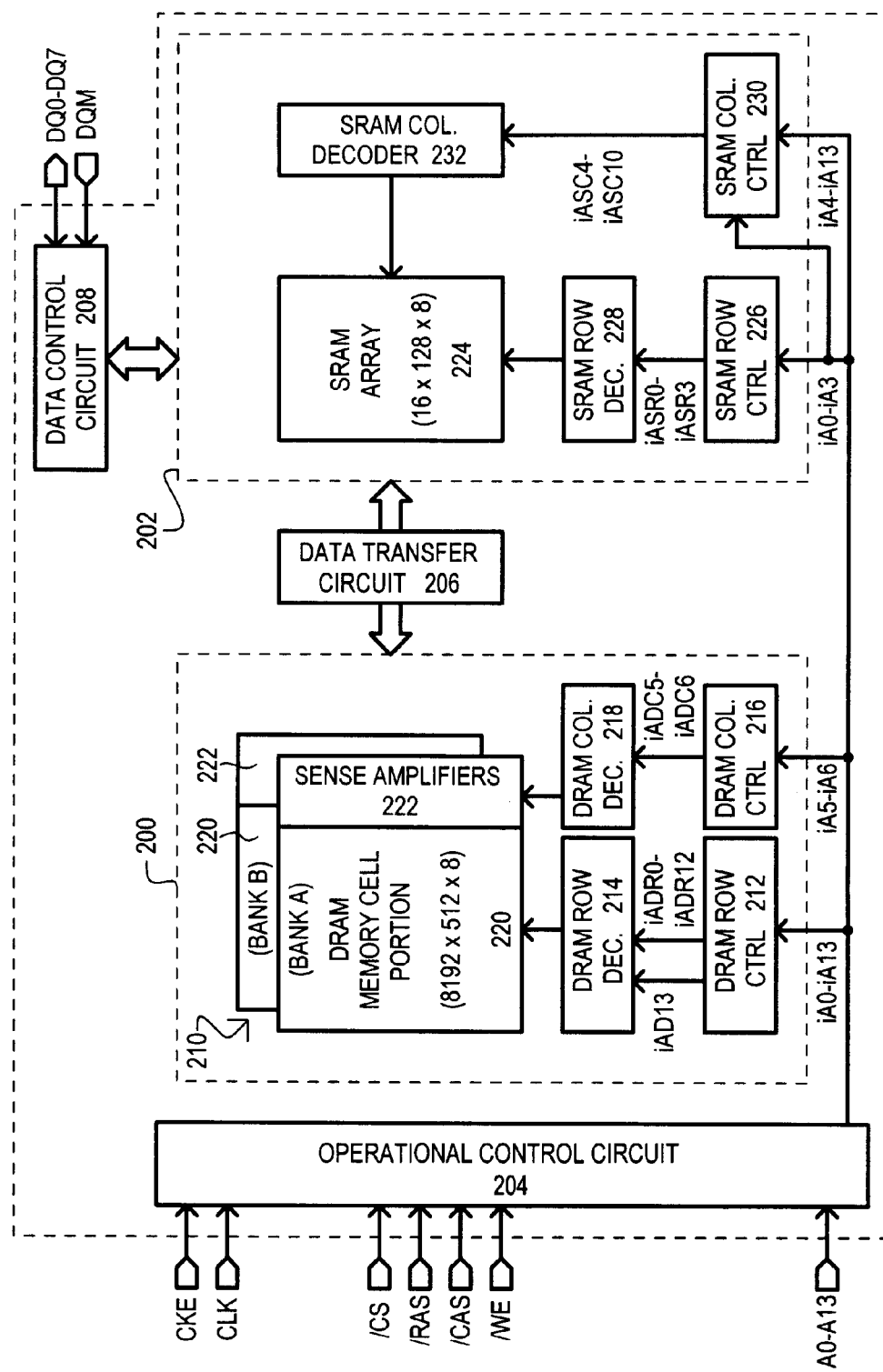
FIG. 2 is a block diagram illustrating the relationship between a main storage portion and a substorage portion according to one embodiment.

Reference will now be made to FIG. 2. FIG. 2 is a block diagram that illustrates the relationship between a main storage portion 200, a substorage portion 202, and a data transfer circuit 206. Such a relationship has been described in an earlier cited application of the present inventor.

The diagram of FIG. 2 shows a semiconductor storage device having a synchronous interface and including a "x8" two bank structure. The structure includes a DRAM array of 64 megabits (Mb) in the main storage portion 200 and a static RAM (SRAM) array of 16 kilobits (kb) in the substorage portion 202. It is understood however, that the present invention is not limited to such a particular structure.

In addition to the main storage portion 200 and substorage portion 202, FIG. 2 also illustrates peripheral circuits, including an operation control circuit 204 and a data control circuit 208. The peripheral circuits (204 and 208) can be utilized when data is transferred between the main storage portion 200 and the substorage portion 202.

The substorage portion 202 can include a number of memory cell groups, each of the memory cell groups functioning as an independent cache.

It is also noted that in the arrangement of FIG. 2, the number of control terminals and address terminals utilized to control the main storage portion 200 and substorage portion 202 can be the same as the number of control terminals and address terminals used to control just the main storage portion 200.

In the particular arrangement of FIG. 2, the main storage portion 200 can include a DRAM array 210 having a number of DRAM cells. The DRAM cells can be arranged into a matrix having rows and columns. The main storage portion 200 can further include a DRAM row control circuit 212, a DRAM row decoder circuit 214, a DRAM column control circuit 216, and a DRAM column decoder circuit 218.

The DRAM row control circuit 212 can receive internal address signals iA0–iA13 and provide bank select and row select signals to the DRAM row decoder circuit 214. The DRAM row decoder circuit 214 can receive a bank select signal iAD13, and in response thereto, select a DRAM bank. The DRAM row decoder circuit 214 can also receive row select signals iADR12–iADR0, and in response thereto, select a DRAM row.

The DRAM column control circuit 216 can receive internal address signals iA6–iA5 and provide column select signals to the DRAM column decoder circuit 218. The DRAM column decoder circuit 218 can receive column select signals iADC5–iADC6, and in response thereto, select DRAM columns.

The DRAM array 210 can include memory cell portions 220 and sense amplifier portions 222. Sense amplifier portions 222 can detect and amplify data stored within a selected memory cell portion 220.

The DRAM array 210 can be divided into a number of blocks, referred to as banks. In one possible arrangement, each bank can include a memory cell portion 220 and a sense amplifier portion 222. In the particular arrangement of FIG. 2, the DRAM array 210 includes two banks, bank A and bank B. One of the banks (A or B) can be selected by a bank select signal iAD 13. A selected memory cell portion 220 within the selected bank can be activated by a main storage control circuit (such as 112 in FIG. 1) according to a main storage activating signal (such as MAIN ACTV of FIG. 1).

In the arrangement of FIG. 2, the substorage portion 202 can include a SRAM array 224. The SRAM array 224 can include a number of SRAM cells arranged into a matrix having rows and columns. The substorage portion 202 can further include a SRAM row control circuit 226, a SRAM row decoder circuit 228, a SRAM column control circuit 230, and a SRAM column decoder circuit 232.

The SRAM row control circuit 226 can receive internal address signals iA0–iA3 and provide row select signals to the SRAM row decoder circuit 228. The SRAM row decoder circuit 228 can select a group of SRAM cells according to signals received from the SRAM row control circuit 226. In the particular arrangement of FIG. 2, groups of SRAM cells are selected according to rows of SRAM cells. Thus, in such an arrangement, the SRAM row decoder circuit 228 can receive row select signals iASR0–iASR3, and in response thereto, select a SRAM row.

The SRAM column control circuit 230 can receive internal address signals iA4–iA13 and provide column select signals to the SRAM column decoder circuit 232. The SRAM column decoder circuit 232 can receive column select signals iASC4–iASC10, and in response thereto, select SRAM columns.

The operation control circuit 204 of FIG. 2 can receive external signals that can control the operation of the semiconductor storage device of FIG. 2. The data control circuit 208 can control the input of data to, and the output of data from the semiconductor storage device.

It is understood that while the arrangement of FIG. 2 includes a DRAM in the main storage portion 200 and an SRAM in the substorage portion 202, the present invention should not be construed as being limited to such an arrangement. Other types of memory devices could be utilized in a main storage portion (such as 200). As just a few of the possible examples, a main storage portion can include SRAM, a masked read-only-memory (ROM), a programmable ROM (PROM), an erasable PROM (EPROM), an electrically erasable PROM (EEPROM), a "flash" EEPROM, a ferroelectric RAM (FRAM or FeRAM), or the like. The type of memory utilized in a main storage portion can be selected according to the particular function of a semiconductor storage device.

It is further understood that particular types of memory can be subject to particular configurations. For example, if a DRAM is used in a main storage portion, such as a DRAM can be a general purpose DRAM, an extended data out DRAM (EDODRAM), a SDRAM, a synchronous graphic RAM (SGRAM), a burst EDODRAM, a double data rate SDRAM (DDR SDRAM), a sync-link DRAM (SLDRAM), a Rambus DRAM (RDRAM), to name but a few examples.

A substorage portion (such as 202) can be subjected to such variations in memory type as well. Preferably, a substorage portion can include a memory type the can be accessed at a higher speed than the memory used in an associated main storage portion.

In the event a main storage portion includes flash EEPROM cells arranged into erasable sectors, it is preferable that a substorage portion have a size that is not less than half the size of an erasable flash EEPROM sector.

If reference is made once again to FIG. 2, the external signals received by the operation control circuit 204 can include a clock enable signal CKE, a clock signal CLK, a chip select signal /CS, a row address strobe signal /RAS, a column address strobe signal /CAS, a write enable signal /WE, and address signals A0 to A13.

The CLK signal can be a reference clock signal for the other external signals. That is, input signals can be input "clocked in") and output signals can output "clocked out") according to the CLK signal. As one particular example, the setup/hold time of each external signal can be established according to the rising edge of the CLK signal as a reference point.

The CKE signal can establish when a CLK signal is valid or not. As just one example, if the CKE signal is high on the rising edge of the CLK signal, the next rising edge CLK signal will be valid. If the CKE signal is low in the rising edge of the CLK signal, the next rising edge CLK signal will be invalid.

The /CS signal can determine if a /RAS, /CAS, or /WE signal will be accepted. When the /CS signal is low on the rising edge of a CLK signal, a /RAS, /CAS and/or /WE signal can be received by an operation control circuit (such as 204) and result in access to a semiconductor storage device. When the /CS signal is high on the rising edge of a CLK signal, a /RAS, /CAS or /WE signal can be ignored by an operation control circuit.

Particular combinations of the /RAS, /CAS and /WE signal can determine the particular operation of a semiconductor storage device.

Referring once again to FIG. 2, the address signals A0 to A13 can be received by the operation control circuit 204 according to the CLK signal. The address signals A0 to A13 can then be transmitted to the DRAM row control circuit 212, DRAM column control circuit 216, SRAM row control circuit 226, and SRAM column control circuit 230. In this way, address signals A0 to A13 can access memory cell portions 220 and SRAM array 224. Address signal A13 can be used to select a particular bank within main storage portion 200.

In addition, if the address signals (A0 to A13) are received by a mode register according to an internal command signal, the address signals (A0 to A13) can be used to establish the way in which data is input/output. Further, the address signals (A0 to A13) can also be used to set the operation of an SRAM column control circuit 230.

As shown in FIG. 2, the data control circuit 208 can receive as inputs, or provide as outputs, a data byte DQ0–DQ7. The data control circuit 208 can also receive data mask signals DQM. DQM signals can mask particular data bits of the input/output data byte DQ0–DQ7.

Having described the general arrangement of a semiconductor storage device in FIG. 2, the operation of such a semiconductor storage device will now be described. It is understood that a semiconductor storage device can be operated by the entry of particular commands. As just one example, numerous variations in external signals can be used to generate such commands.

Referring now to FIG. 3, an example of various commands for controlling a semiconductor storage device, such as that shown by FIG. 2 is set forth in a table. The table of FIG. 2 includes a column of various commands and the various combinations of external control signals that can be used to generate such commands. One skilled in the art would recognize that the particular combinations are exemplary, and other signal combinations and/or additional commands could be accepted by a semiconductor storage device.

FIG. 3 shows the state of each external control signal at the rising edge of the CLK signal, and the resulting operation determined at that time. In FIG. 3, a symbol "H" represents a high logic level. A symbol "L" represents a low logic level. A symbol "X" represents an optional level. One skilled in the art would recognize an optional level can include a "don't care" logic state (i.e., the signal could be high or low).

The CKE signal of FIG. 3 is shown to include two columns, an "n-1" column and an "n" column. The n-1 column of a clock enable signal shows the state of the CKE signal prior to the clock cycle of interest (the clock cycle when the external control signals are applied). Accordingly, in the following discussion, references to the CKE signal refer to the CKE signal at time n-1.

The commands of FIG. 3 will now be described in the order that they appear.

A "Read" command can result in the reading of data from a SRAM array (such as 224 in FIG. 2). For the particular read command of FIG. 3, the external control signals at the rising edge of a CLK signal are CKE=H, /CS=L, /RAS=H, /CAS=L and /WE=H.

When a read command of FIG. 3 is received by a semiconductor storage device, address signals (such as A0 to A3) can be received as row selection signals for an SRAM array (such as 224). In addition, address signals (such as A4 to A10) can be received as column selection signals for an SRAM array (such as 224).

Data read from a SRAM array 224 can be supplied to a data control circuit (such as 208). The read data can then be output from the data control circuit a predetermined latency following the application of the read command. In the event a DQM signal is high, the read data will be masked, preventing the read data from being output from a semiconductor storage device.

In a more particular example, a read command can select a cell within an SRAM array (such as 224) with a row selection and a column selection. A row can be selected according to selection signals iASR0 to iASR3, and a column can be selected according to selection signals iASC4 to iASC10. As shown in FIG. 2, the iASR0 to iASR3 and iASC4 to iASC10 signals can be generated from selection signals iA0 to iA13. Data from a selected cell can be output to a data control circuit (such as 208). Data can be output from the data control circuit in a specified format through a data amplifier (like sense amplifiers 222).

A "Write" command can result in the writing of data to a SRAM array (such as 224 in FIG. 2). For the particular write command of FIG. 3, the external control signals at the rising edge of a CLK signal are CKE=H, /CS=L, /RAS=H, /CAS=L and /WE=L.

When a write command of FIG. 3 is received by a semiconductor storage device, address signals (such as A0 to A3) can be received as row selection signals for a SRAM array (such as 224). In addition, address signals (such as A4 to A10) can be received as column selection signals for an SRAM array (such as 224).

Data that is to be written into a SRAM array 224 can be received as external data values (such as DQ0 to DQ7) by a data control circuit (such as 208). The write data can be received at a predetermined latency following the application of the write command. In the event a DQM signal is high, the write data can be masked, and not input to the semiconductor storage device.

In a more particular example, a write command can select a cell within an SRAM array (such as 224) with a row selection and a column selection. A row can be selected according to selection signals iASR0 to iASR3. A column can be selected according to selection signals iASC4 to iASC10. As shown in FIG. 2, the iASR0 to iASR3 and iASC4 to iASC10 signals can be generated from selection signals iA0 to iA13. Data that is to be written could be received by data input/outputs (such as DQ0–DQ7) and written into a selected cell through a write buffer.

The read and write operations described can be performed without necessarily affecting the DRAM array (such as 210) of a main storage portion 200 or a data transfer circuit 206. Therefore, such read and write operations to one group of SRAM cells can take. place while data transfers occur between a different group of SRAM cells, or operations take place inside the DRAM array. Thus, even when a read or write operation is taking place, it is possible to perform data transfer operations between a DRAM array and a row of SRAM cells (not accessed by the read or write operation). It may also be possible for the DRAM array to execute a received command while such a read or write operation is taking place.

A "Prefetch" command can perform a data transfer from a DRAM memory cell portion (such as 220) of a main storage portion (such as 200) to a SRAM array (such as 224). For the particular prefetch command of FIG. 3, the external control signals at the rising edge of a CLK signal are CKE=H, /CS=L, /RAS=H, /CAS=H, /WE=L, A10=L and A9=L.

When a prefetch command of FIG. 3 is received by a semiconductor storage device, a first set of address signals (such as A0 to A3) can be received as row selection signals for an SRAM array (such as 224), a second set of address signals (such as A5 and A6) can be received as column selection signals for a DRAM array (such as 210), and another set of address signals (such as iA13) can be received as a bank selection signal for the DRAM array.

When a prefetch command is received, a memory cell portion (such as 220) for a particular bank will be selected according to the iA13 signal. The memory cell portions may have already been activated by an active command. For the purposes of this description it is assumed that bank A is selected.

A bit line or group of bit lines within the memory cell portion of the selected bank can be selected according to the iA5 and iA6 signals. Data on the selected bit line can be amplified by sense amplifier portion 222. The amplified data on the selected bit line can be transmitted through data transfer circuit 206 to data transfer bus lines.

A cell or group of cells can be selected by activating a row within SRAM array 224 according to the iA0 and iA3 signals. The selected cell can store data on data transfer bus lines, overwriting any previously stored data.

After a data transfer has taken place (for example, between a DRAM array 210 and a SRAM array 224), transfer of data through a data transfer circuit (such as 206) can be stopped. In the particular arrangement of FIG. 2, the amount of data that can be transferred at one time by a prefetch command is 128×8 bits.

A "Prefetch (Auto-Precharge)" command can perform a data transfer from a DRAM array (such as 210) to a SRAM array (such as 224) and then automatically perform a precharge operation in the DRAM array. For the particular prefetch auto-precharge command of FIG. 3, the external control signals at the rising edge of a CLK signal are CKE=H, /CS=L, /RAS=H, /CAS=H, /WE=L, A10=H and A9=L.

A prefetch auto-precharge operation can proceed in the same general fashion as the prefetch operation described above. Namely, address signals (such as A0 to A3) can select a row address of an SRAM array (such as 224), other address signals (such as A5 and A6) can select columns within a DRAM array (such as 210), and another address signal (such as iA13) can select a DRAM bank.

When a prefetch auto-precharge command is received, a memory cell portion (such as 220) for a particular bank will be selected according the iA13 signal. The memory cell portion may have already been activated by an active command. For the purposes of this description it is assumed that bank A is selected.

A bit line or group of bit lines within the memory cell portion of the selected bank can be selected according to the iA5 and iA6 signals. Data on the selected bit line can be amplified by sense amplifier portion 222. The amplified data on the selected bit line can be transmitted through data transfer circuit 206 to data transfer bus lines.

A cell or group of cells of a row within SRAM array 224 can be selected according to the iA0 and iA3 signals. The selected cell can store data on data transfer bus lines, overwriting any previously stored data.

After a data transfer has taken place (for example, between a DRAM array 210 and SRAM array 224), transfer of data through a data transfer circuit (such as 206) can be stopped.

Once a data transfer has been stopped, after a specified time has elapsed, a previously selected word line within DRAM memory cell portion 220 will be brought to a non-selected state. The DRAM memory cell portion 220 can then undergo an internal precharge operation (a balancing of bit line and sense amplifier potentials). A precharge operation will be described in more detail below. Thus, after a prefetch auto-prechatge command is entered, after a specified time period, a memory cell portion 220 can be automatically placed into a precharged (non-selected) state.

A "Restore" command can perform a data transfer from a SRAM array (such as 224) to a DRAM array (such as 210). A restore command can be executed over multiple cycles. For example, if two CLK cycles are given as CLK1 and CLK2, a restore operation could occur over the CLK1 and CLK2 cycles. For the particular restore command of FIG. 3, the external control signals at the rising edge of a CLK signal are CKE=H, /CS=L, /RAS=H, /CAS=H, /WE=L, A10=L and A9=H.

A restore command can begin with address signals (such as A0 to A3, A5 and A6, and A13) being clocked in on a rising edge of a first clock cycle CLK1. The A0 to A3 signals can select a row in a SRAM array (such as 224), the A5 and A6 signals can select columns in a DRAM array (such as 210), and the A13 signal can select a bank of the DRAM array.

On the rising edge of a subsequent clock cycle CLK2, address signals (such as A0 to A12, A13) can be clocked in. The A13 signal can select a bank that is the destination of a data transfer. The A13 value on the CLK2 cycle can be the same as that on the CLK1 signal. The A0 to A12 signals can select a row in a DRAM array that is the destination of a data transfer.

A restore command may be better understood with particular reference to FIG. 2. When a restore command is input on a first clock cycle, selection signals iA0 to iA12 can be considered first cycle selection signals i1A0 to i1A12. On a second clock cycle, selection signals iA0 to iA12 can be considered second cycle selection signals i2A0 to i2A12.

Data of the SRAM array 224 can be selected by selection signals i1A0 to i1A3 generated by a first clock cycle CLK1. The data can be transmitted to a data transfer bus line of a bank within DRAM array 210. Such a bank may be selected according to the iA13 signal.

Data on data transfer bus lines may then be transferred to bit lines within a memory cell portion 220 according to selection signals i1A5 and i1A6.

Subsequently, a word line of the above noted memory cell portion 220 can be selected by selection signals i2A0 to i2A12 generated on a second clock signal CLK2. A signal iA13 can continue to select a DRAM array 210 bank. The selected word line can result in data being placed on corresponding bit lines of the memory cell portion 220.

A sense amplifier portion 222 corresponding to the accessed memory cell portion 220 can amplify data output by the selected word line. However, for those columns selected by the i1A5 and i1A6 signals, the data to be written on the transfer lines can be amplified by sense amplifier portion 220. The transfer of data from the SRAM array 224 can stop once a word line is selected in the DRAM array 210. In the particular embodiment of FIG. 2, the amount of data that can be transferred at one time in a restore command can be 128×8 bits.

Also set forth in FIG. 3 is a "Restore (Auto-Precharge)" command. A restore (auto-precharge) command can perform a restore operation that is followed by a precharge operation.

A restore (auto-precharge) command can be executed over multiple cycles, such as a first CLK cycle CLK1 and a second clock cycle CLK2. For the particular restore (auto-precharge) command of FIG. 3, the external control signals at the rising edge of a CLK signal are CKE=H, /CS=L, /RAS=H, /CAS=H, /WE=L, A10=H and A9=H.

In a restore (auto-precharge) command, at the rising edge of a first external clock signal CLK1, address signals address signals (such as A0 to A3, A5 and A6, and A13) can be input. The A0 to A3 signals can select a row in an SRAM array (such as 224), the A5 and A6 signals can select columns in a DRAM array (such as 210), and the A13 signal can select a bank of the DRAM array.

On the rising edge of a subsequent clock cycle CLK2, address signals (such as A0 to A12, A13) can be clocked in. The A13 signal can select a bank that is the destination of a data transfer. The A13 value on the CLK2 cycle can be the same as that on the CLK1 signal. The A0 to A12 signals can select a row in a DRAM array that is the destination of a data transfer.

If reference is made to FIG. 2, when a restore command is input on a first clock cycle, selection signals iA0 to iA12 can be considered first cycle selection signals i1A0 to i1A12, and can include address data. On a second clock cycle, selection signals iA0 to iA12 can be considered second cycle selection signals i2A0 to i2A12.

A restore (auto-precharge) operation can continue in the same general fashion as a previously described restore operation.

In particular, data of the SRAM array 224 can be selected by selection signals i1A0 to i1A3 generated on a first clock cycle CLK1. The data can be transmitted to a data transfer bus line of a bank within DRAM array 210 selected according to the iA13 signal. Data on data transfer bus lines can be transferred to bit lines according to selection signals i1A5 and i1A6.

Subsequently, a word line can be selected by selection signals i2A0 to i2A12, with an iA13 signal continuing to select a DRAM array 210 bank. The selected word line can result in data being placed on corresponding bit lines of the memory cell portion 220.

A sense amplifier portion 222 can amplify data output by the selected word line, except for those columns selected by the i1A5 and i1A6 signals, which will receive amplified write data from the transfer lines.

As in the case of the previous restore command, the transfer of data in a restore (auto-precharge) command can stop once a word line is selected in the DRAM array 210.

A restore (auto-precharge) operation can continue with the selected word line returning to a de-selected state after a specified time has elapsed. The DRAM memory cell portion 220 can then undergo an internal precharge operation that will be described in more detail below. Thus, when a restore auto-precharge command is entered, after a specified time period, a memory cell portion 220 can be automatically placed into a precharged (non-selected) state.

An "Active" command is set forth in FIG. 3. An active command can activate a memory cell portion. 220 of a selected bank in the DRAM array 210. For the particular active command of FIG. 3, the external control signals at the rising edge of a CLK signal are CKE=H, /CS=L, /RAS=L, /CAS=H and /WE=H.

When an active command is entered, an address signal (such as A13) can be received as a bank selection address, while other address signals (such as A0 to A12) can be received as row selection addresses of a memory cell portion 220.

In the arrangement of FIG. 2, when an active command is applied, a word line within memory cell portion 220 can be selected by selection signals iA0 to iA12. The bank that includes the memory cell portion 220 can be selected by the selection signal iA13.

The selection of a word line can result in a group of memory cells placing data onto bit lines within the memory cell portion 220. The data on the bit lines can be sensed and amplified by a sense amplifier portion 222. In the particular arrangement of FIG. 2, the amount of data that can be amplified at one time by an active command is 512×8 bits.

It may be desirable to select another word line of a bank within a DRAM array 210 that is already activated. In such a case, it may be necessary to place the bank in a precharge state and then apply another active command. Such an active command can be considered equivalent to driving a /RAS signal low in an ordinary DRAM.

FIG. 3 includes a "Precharge" command. A precharge command can precharge (place in a non-activated state) a memory cell portion (such as 220) in the bank of a DRAM array (such as 210). For the particular precharge command of FIG. 3, the external control signals at the rising edge of a CLK signal are CKE=H, /CS=L, /RAS=L, /CAS=H, and /WE=L.

In a precharge command an address signal can have a predetermined value (A10=L) while another bank select signal (A13) is valid. A bank select signal can be considered valid when it designates a bank that has previously received an active command. If a bank is selected for a precharge operation that has not previously received an active command, the bank select signal can be considered invalid. Given a valid bank select signal, the memory cell portion of the bank can be precharged (de-activated).

Prior to a precharge command, a word line within a memory cell portion (such as 220) can be activated. The memory cell portion can be in a bank selected by a bank select signal (such as iA13). When a precharge command is entered, the activated word line can be de-activated. In addition, the potential of bit lines and sense amplifiers can be balanced with respect to one another. Following a precharge operation, a memory cell portion can be ready to receive the next application of an active command. Such a precharge operation can be considered equivalent to driving a /RAS signal high in an ordinary DRAM.

FIG. 3 also includes an "All-bank Precharge" command. An all-bank precharge command can precharge all the banks of a DRAM array (such as 210). Such an operation can result in the DRAM array being precharged (de-activated), thus ending the activated state of memory cell portions of all banks. For the particular all-bank precharge command of FIG. 3, the external control signals at the rising edge of a CLK signal are CKE=H, /CS=L, /RAS=L, /CAS=H, /WE=L, and A10=H.

When an all-bank precharge command is entered, all word lines of a DRAM array (such as 210) can be placed in an inactive state. Further, the potential of the bit lines and sense amplifiers can be balanced with one another.

Once an all-bank precharge operation has ended, all banks of a DRAM array can be ready for a subsequent input of an active command. An all-bank precharge command can be considered equivalent to driving a /RAS signal high in an ordinary DRAM.

A "/CAS before /RAS (CBR) Refresh" command is also illustrated in FIG. 3. A CBR refresh command can refresh DRAM cell data according to a refresh address. A refresh address in a CBR refresh mode can be automatically generated by circuits internal to a semiconductor memory device. For the particular CBR refresh command of FIG. 3, the external control signals at the rising edge of a CLK signal are CKE=H, /CS=L, /RAS=L, /CAS=L and /WE=H.

If reference is made to the particular example of FIG. 2, when a CBR refresh command is entered, selection signals iA0 to iA12 and iA13 are automatically generated by internal circuits. A bank of DRAM array 210 is selected by the iA13 signal and a word line within the selected bank is selected by the iA0 to iA12. The selected word line can result in data being output on accompanying bit lines in a memory cell portion 220. A sense amplifier portion 222 can detect and amplify the data being output. Such amplification can involve driving data values on the bit lines themselves.

The data that is detected and amplified on the bit lines can be written back into a memory cell portion 222 through the bit lines. Then, after a specified time has elapsed, the selected word line can return to a de-selected state. The potential of the bit lines and sense amplifiers can be balanced with one another, and the refresh operation can be ended.

The operation of a VCSDRAM according to the first embodiment will now be described with reference to FIGS. 1, 4 and 5.

Figure 4:
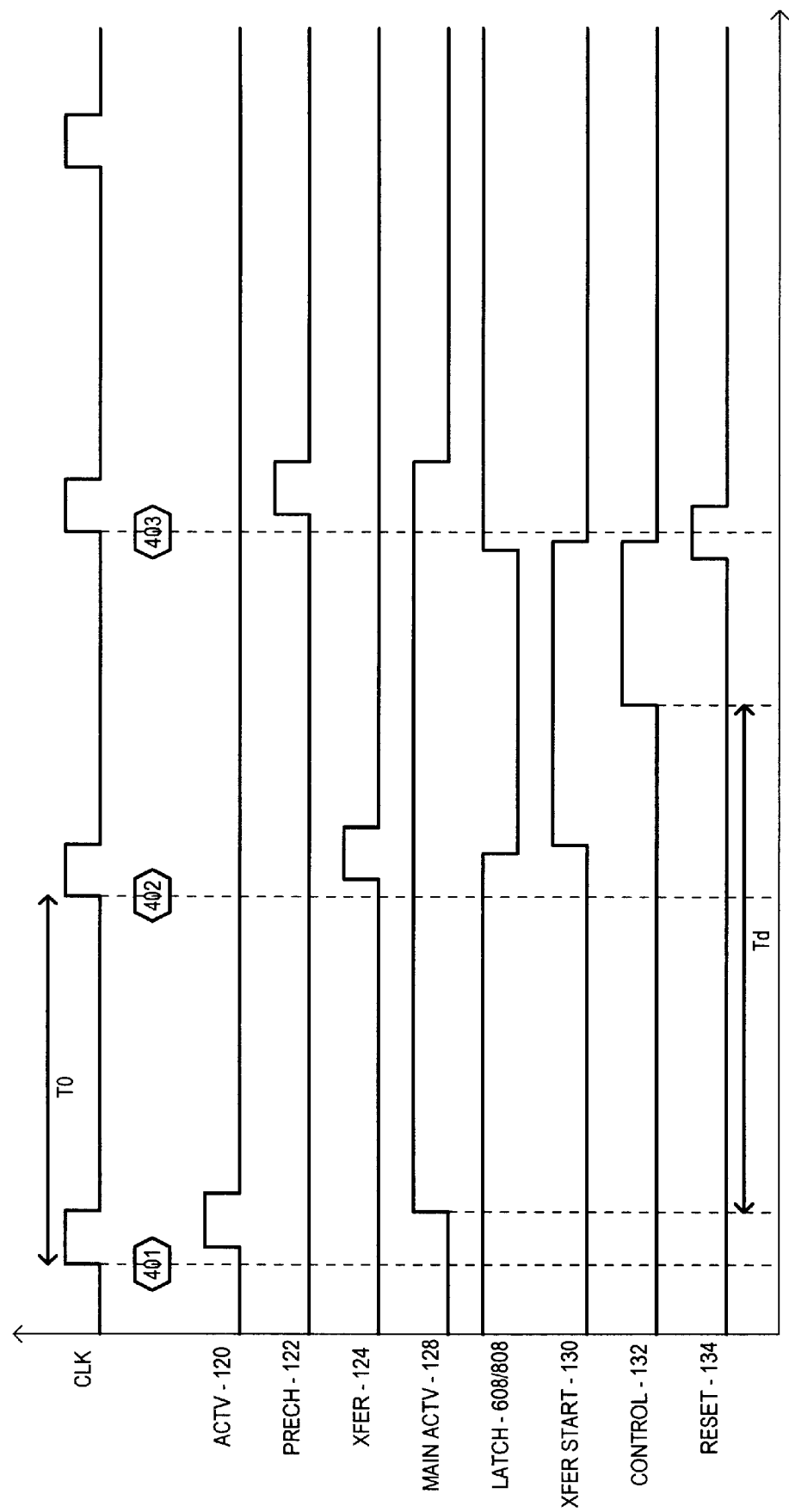
FIG. 4 is a timing diagram illustrating a conventional transfer operation timing test.
Figure 5:
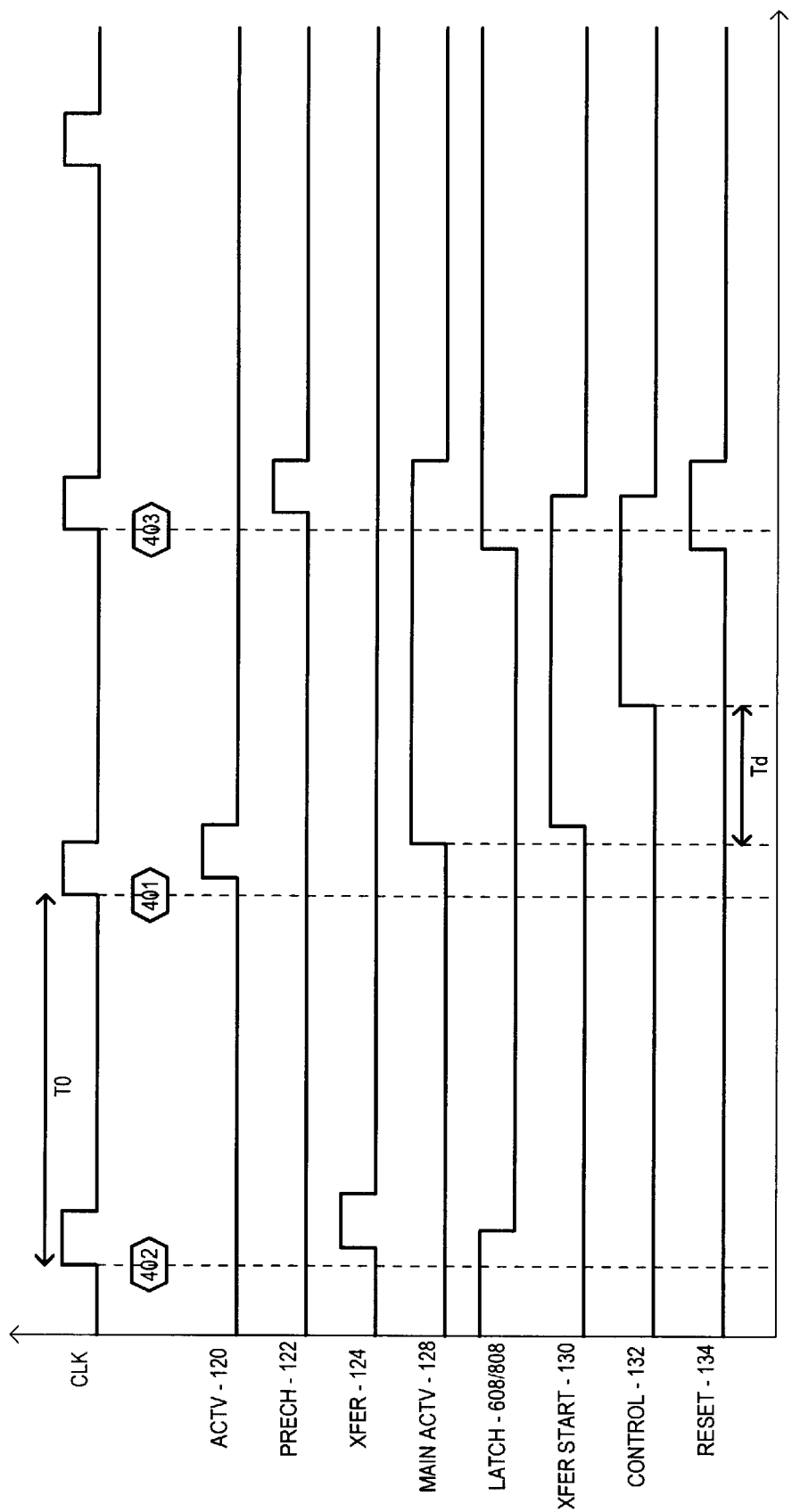
FIG. 5 is a timing diagram illustrating a high-speed transfer operation test time according to the embodiments.

In FIGS. 4 and 5, item 401 represents the application of an active command, item 402 represents the application of a transfer command, and 403 represents the application of a precharge command.

In FIG. 4, a command decoder circuit 102 can receive an active command 401 and generate an ACTV signal. The ACTV signal can be received by main store activator 104 which can generate a MAIN ACTV signal.

Next, the command decoder circuit 102 can receive a transfer command 402 and generate a XFER signal.

When the MAIN ACTV and XFER signals are generated, a transfer starter 106 can latch a XFER signal by means of a latch circuit (such as that shown as 602 in FIG. 6) and output a XFER START signal.

Next, the transfer controller 108 can receive a XFER START signal and generate a CONTROL signal. The CONTROL signal can control a substorage portion 116 and a data transfer operation by a data transfer circuit 118 (or that shown as 206 in FIG. 2).

When a CONTROL signal is generated, a main storage control circuit 112 and substorage portion 116 are operated, and data can be transferred to the main storage portion 114 according to the MAIN ACTV signal.

Once a transfer operation to a main storage control circuit 112 has ended, the transfer controller 108 generates a RESET signal.

When a RESET signal is output from the transfer controller 108, the latching of a command signal by a latch circuit (such as 602) within the transfer starter 106 can be released. The XFER START signal can then be driven low.

Referring to FIGS. 4 and 5, various time periods are set forth. A time period T0 can represent the period of an external clock signal. A time period Td can represent a time interval between when a MAIN ACTV signal transitions high (and a main storage portion 114 is activated by a main storage control circuit 112) and a time when a transfer operation is performed according to a CONTROL signal.

As was noted previously, the shorter a time interval Td, the greater the chance of insufficient amplification of memory cell data within a main storage portion 114. Further, the shorter a Td time, the more likely fluctuations in a power supply voltage (such as a high power supply voltage and a ground supply potential) will adversely affect the operation of the VCSDRAM.

It can be desirable to test a VCSDRAM at a minimum Td time, determined by a timing specification.

In the arrangement of FIG. 4, provided a Td specification is greater than a T0 time, the Td specification can be tested. However, in the event a Td specification is less than the external clock period T0, it cannot be tested, as a transfer command 402 cannot be entered in a short enough time period following the active command 401.

To overcome the testing drawback, the first embodiment 100 can operate with the timing set forth in FIG. 5.

The first embodiment 100 can receive a transfer command 402 at the command decoder 102. The command decoder 102 can generate a XFER signal. The XFER signal can result in a latch circuit (such as 602) latching a XFER command within the transfer starter 106.

As set forth in FIG. 5, since a bank within main storage part 114 is not activated, the MAIN ACTV signal is not activated (is low). With an inactive MAIN ACTIV signal provided as an input to the transfer starter 106, the XFER START signal will remain inactive even though a XFER command is latched.

Next, the first embodiment 100 can receive an active command 401. The active command 401 can be decoded by command decoder 102, and an ACTV signal can be generated. The main store activator 104 can receive the ACTV signal and activate a MAIN ACTV signal which can be applied to the main storage control circuit 112 and the transfer starter 106.

As set forth in FIG. 5, when the MAIN ACTV signal is activated, the transfer starter 106 activates a XFER START signal. The transfer controller 108 can receive the XFER START signal and generate a CONTROL signal. The CONTROL signal can control a channel buffer and transferring operations, enabling the transfer of data to the main storage portion 114.

Accordingly, in the operational mode described by FIG. 5, a transfer operation can be performed according to a shortest time interval Td following the activation of the MAIN ACTV signal. Therefore, a test can be performed for a Td specification regardless of the period of the external clock signal T0.

In this way, according to the first embodiment 100, a data transfer timing (Td) test can be performed even when the period of the external clock T0 is longer than the time interval Td. This can enable semiconductor device to be tested with low test frequency equipment, which can reduce the overall cost of a semiconductor device.

Figure 8:
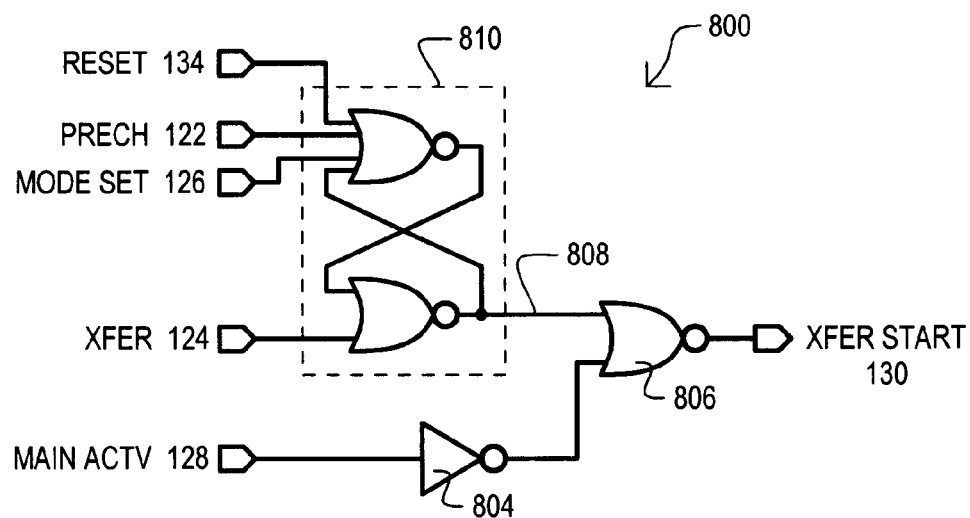
FIG. 8 is a schematic diagram illustrating a transfer operation start signal generating circuit that may be used in the second embodiment.
Figure 7:
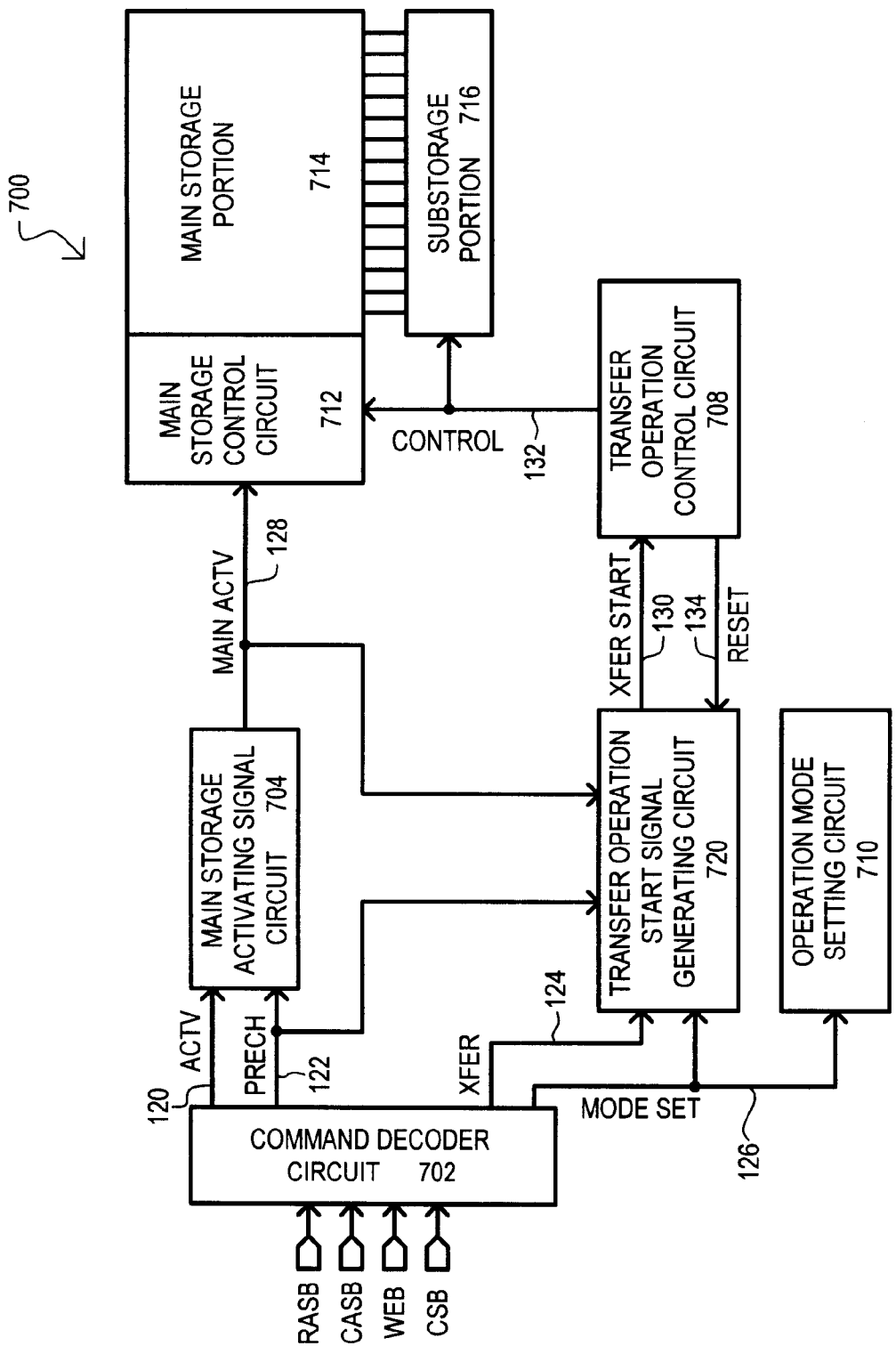
FIG. 7 is a block diagram of a second embodiment.
Figure 9:
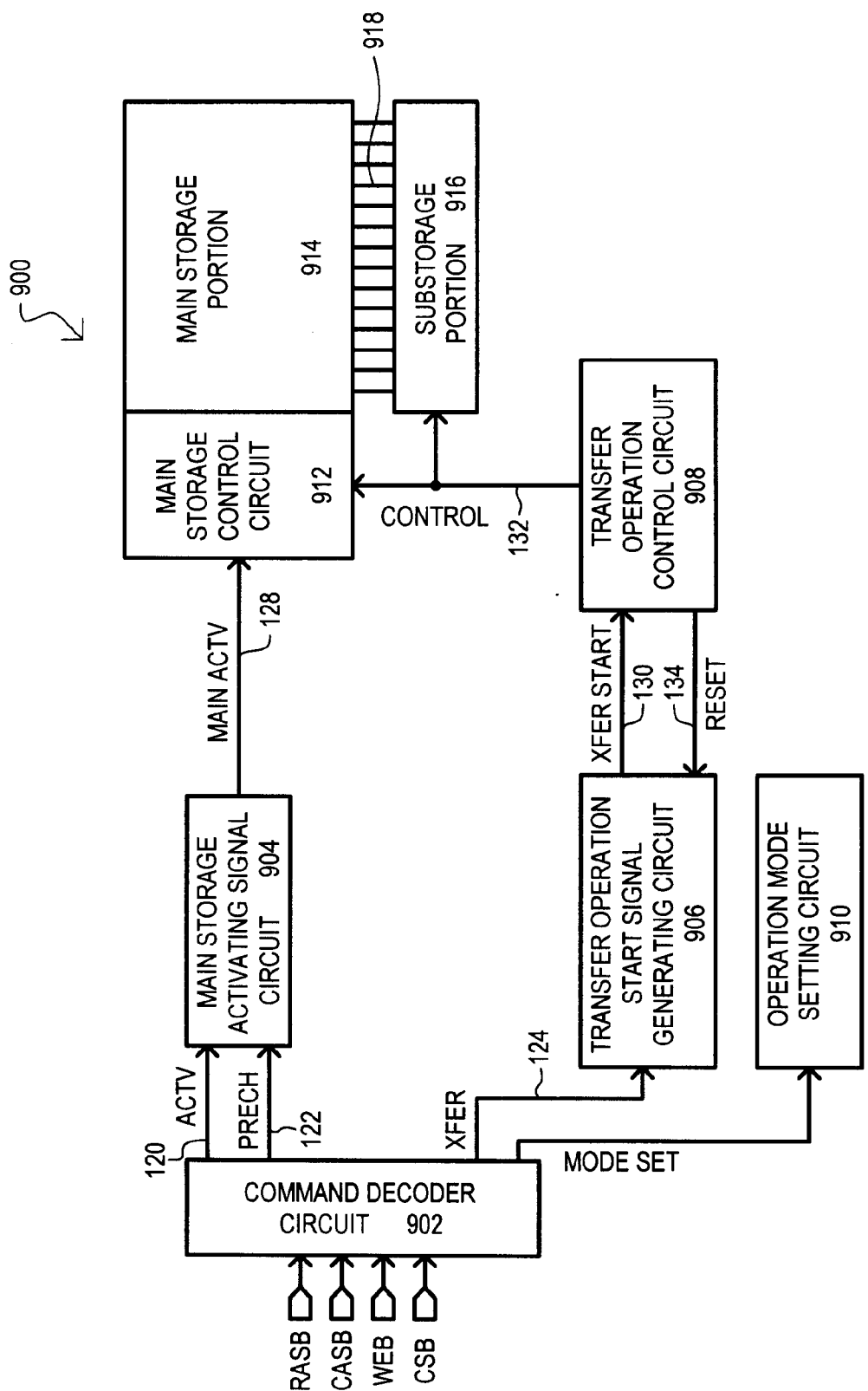
FIG. 9 is a block diagram of a conventional virtual channel synchronous dynamic random access memory (VCSDRAM).

A second embodiment will now be described in conjunction with FIG. 7. FIG. 7 is a block diagram illustrating VCSDRAM according to the second embodiment. FIG. 8 is a schematic diagram of a transfer starter that may be used in the second embodiment.

The second embodiment is set forth in FIG. 7 designated by the general reference character 700. The second embodiment 700 can include some of the same general constituents as the first embodiment. To that extent, like portions will be referred to by the same reference character but with the first digit being a "7" instead of a "1." The second embodiment 700 can also generate timing signals, such as those set forth in FIGS. 4 and 5. Therefore, such timing signals are represented by the same reference characters as FIGS. 4 and 5.

One way in which the VCSDRAM of the second embodiment 700 differs form that of the first embodiment 100 is that the second embodiment 700 includes a transfer operation start signal generating circuit (transfer starter) 720 that can receive precharge signal (PRECH) 122 and a mode register set signal (MODE SET) 126 in addition to a main storage activating signal (MAIN ACTV) 128. In this arrangement, a value latched within the transfer starter 720 can be determined according to the PRECH and MODE SET signals, as well as the MAIN ACTV and XFER signals.

Referring now to FIG. 8, the transfer starter is designated by the general reference character 800, and can include some of the same circuit constituents as the transfer starter illustrated in FIG. 6. To that extent, like circuit portions will be referred to by the same reference character but with the first digit being a "8" instead of a "6." One skilled in the art would recognize that one way in which the transfer starter 800 differs from that of FIG. 6 is that a latch circuit 810 includes a four input NOR gate that can receive three reset inputs, including the RESET signal, a PRECH signal and a MODE SET signal.

To better understand the circuit of FIG. 8, the circuit of FIG. 6 will first be discussed. When power is first applied to a transfer starter circuit (such as 600), the state of the latch circuit 602 may be undetermined. As just one example, the latch circuit 602 may power up in a state that mimics a XFER signal latched state (e.g., a RESET signal input and XFER signal input are both low while the latch output node 608 is also low).

If a latch circuit 602 powers up in such a state and the MAIN ACTV signal is high, an erroneous XFER START signal can be generated. Consequently, an erroneous transfer operation can take place.

If a latch circuit 602 powers up in such a state and the MAIN ACTV signal is low, an erroneous transfer operation can be prevented.

A VCSDRAM according to the second embodiment 700 can prevent an erroneous transfer of data that can be caused by an undesirable latch power up state and active MAIN ACTV signal.

In particular, when power is applied to the second embodiment 700, a PRECH and MODE SET signal can be generated. As show in FIG. 7, the PRECH and MODE SET signals can be applied to the transfer starter 720, and can initialize a latch circuit within (such as 800).

One skilled in the art would recognize that in the particular example of FIG. 8, a high-going PRECH pulse and/or MODE SET pulse will "release" any latched value (i.e., reset the latch), resulting in the output node 808 being high.

Therefore, according to the second embodiment 700, a VCSDRAM may advantageously initialize a latch circuit within a transfer starter 720 upon power up. This can establish the state of a latch circuit (such as 810), and an erroneous transfer operation can be prevented.

According the embodiments of the present invention described above, a test for a data transfer operation time (Td) can be performed when the Td time is less than an external clock period (T0). This can allow devices to be tested with lower speed test machines. Lower speed test machines can be less expensive to purchase and/or operate. Consequently, the overall production costs of a device may be lowered.

Furthermore, particular embodiments have been described that can prevent erroneous data transfer operations upon power up. A latch circuit that can store a transfer command signal (XFER) can be initialized on power-up by a precharge signal (PRECH) and/or a mode register set signal (MODE SET). Such an initialization operation can prevent a latch circuit from powering up in an undesirable logic state that can lead to an erroneous transfer operation.

One skilled in the art would recognize that while the various embodiments illustrate approaches that can test for a data transfer operation time (Td), and that such a test can be particularly valuable and advantageous for VCSDRAMs, such a particular test should not be construed as limiting the invention thereto. Other test parameters, that are conventionally tested by the entry of two consecutive commands might also be tested. A resetable latch circuit could be used to establish a particular logic state, then an operation could be subsequently tested by the application of a single command. One of the many possible examples of a resetable latch circuit are the various forms of master-slave flip-flop circuits.

One skilled in the art would also recognize that the advantageous power-up approaches illustrated by the embodiments may be utilized to test other device parameters. Conventionally generated power-up signals could be used to initialize latch circuits utilized in a test operation. Further, test specific power-up signals could also be used to initialize such latch circuits.

It is thus understood that while various particular embodiments set forth herein have been described in detail, the present invention could be subject to various changes, substitutions, and alterations without departing from the spirit and scope of the invention. Accordingly, the present invention is intended to be limited only as defined by the appended claims.

What is claimed is:

1. A virtual channel synchronous dynamic random access memory (VCSDRAM), comprising:

a command decoder circuit that decodes external command signals and generates at least a precharge command signal and a transfer command signal as internal signals;

a main storage portion;

a substorage portion coupled to the main storage portion, data being transferred between the main storage portion and the substorage portion according to a transfer operation start signal; and a transfer operation start signal generating circuit that can latch the transfer command signal, receive a main storage activating signal generated in response to an active command signal, generate the transfer operation start signal, and reset the transfer operation start signal when the data has been transferred between the main storage portion and the substorage portion.

2. The VCSDRAM of claim 1, wherein:

the transfer operation start signal generating circuit includes a latch circuit that can latch the transfer command signal, the latch circuit being reset by at least one internal signal.

3. The VCSDRAM of claim 2, wherein:

the internal signals that can reset the latch circuit include a precharge command signal and a transfer command signal.

4. The VCSDRAM of claim 2, wherein:

the latch circuit is reset when power is applied to the VCSDRAM.

5. A virtual channel synchronous dynamic random access memory (VCSDRAM), comprising:

a command decoder circuit that decodes external command signals and generates at least a transfer command signal;

a transfer operation start signal generating circuit that can latch the transfer command signal, receive a main storage activating signal generated in response to an active command signal, generate a transfer operation start signal, and reset the transfer operation start signal when data has been transferred between a main storage portion and a substorage portion; and a transfer operation control circuit that can receive the transfer operation start signal and generate a control signal that controls the transfer of data between the main storage portion and the substorage portion.

6. The VCSDRAM of claim 5, wherein:

the command decoder circuit can further generate a precharge signal; and the transfer operation start signal generating circuit can be intialized by the precharge signal.

7. The VCSDRAM of claim 5, wherein:

the command decoder circuit can further generate a mode set signal; and the transfer operation start signal generating circuit can be intialized by the mode set signal.

8. A semiconductor device having a timing specification for the amount of time between a first command and the activation of a control start signal generated in response to a second command, comprising:

a command decoder outputting an active first command signal in response to a first command and activating a second command signal in response to the second command; and a control signal generating circuit that can store the second command signal, the control signal generating circuit activating the control start signal according to the stored second command signal when enabled, the control signal generating circuit being enabled by the active first command signal.

9. The semiconductor device of claim 8, wherein:

the semiconductor device is a memory device having a first storage portion and a second storage portion;

the first command is an active command that can activate the first storage portion; and the second command is a transfer command the can enable the transfer of data between the first storage portion and the second storage portion.

10. The semiconductor device of claim 9, wherein:

the first storage portion includes an array of dynamic random access memory (DRAM) cells; and the second storage portion includes an array of static random access memory cells.

11. The semiconductor device of claim 9, wherein:

the first storage portion includes a plurality of DRAM cell arrays arranged into banks and the first command can activate a particular bank.

12. The semiconductor device of claim 8, wherein:

the control signal generating circuit includes a latch circuit that can latch the second command signal.

13. The semiconductor device of claim 12, wherein:

the latch circuit includes a set-reset flip-flop having at least one set input, at least one reset input, and at least one data output, at least one set input receiving the second command signal.

14. The semiconductor device of claim 13, wherein:

the control circuit further includes an enable gate that can provide the control start signal in response to the data output of the latch circuit when enabled, the enable gate being enabled by the active first command signal.

15. The semiconductor device of claim 14, wherein:

the enable gate is a logic gate having one input coupled to at least one output of the latch circuit and another input that can receive the active first command signal.

16. The semiconductor device of claim 12, further including:

a control circuit that can receive the control start signal and after a predetermined time period, generate a reset signal;

a set-reset flip-flop includes a reset input that can receive the reset signal.

17. The semiconductor device of claim 8, wherein:

the command decoder can generate at least one internal signal when a power is applied to the semiconductor device; and the control signal generating circuit can be reset to a predetermined value in response to at least one internal signal.

18. (Amended) The semiconductor device of claim 17, wherein:

the control signal generating circuit includes a set-reset flip-flop having at least one set input, at least one reset input, and at least one data output, at least one set input receiving the second command signal, at least one reset input receiving at least one internal signal.

19. The semiconductor device of claim 17, wherein:

the semiconductor device includes a memory cell array that can be precharged;

the command decoder can receive a precharge command and generate a precharge signal as one of the internal signals; and at least one reset input can receive the precharge signal.

20. The semiconductor device of claim 17, wherein:

the semiconductor device can operate in a plurality of different modes that can be established by a mode set command;

the command decoder can receive the mode set command and generate a mode set signal as one of the internal signals; and at least one reset input can receive the mode set signal.

* * * * *